United States Patent
Kurihara (10) Patent No.: US 6,975,543 B2
(45) Date of Patent: Dec. 13, 2005

(54) NONVOLATILE SEMICONDUCTOR MEMORY DEVICE WHICH STORES TWO BITS PER MEMORY CELL

(75) Inventor: Kazuhiro Kurihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/085,133

(22) Filed: Mar. 22, 2005

(65) Prior Publication Data

US 2005/0162921 A1    Jul. 28, 2005

Related U.S. Application Data (63) Continuation of application No. PCT/JP03/05457, filed on Apr. 28, 2003.

(51) Int. Cl.[7] .............................................. G11C 16/06
(52) U.S. Cl. ............... 365/185.22; 365/222; 365/185.2
(58) Field of Search ................... 365/185.22, 185.2, 365/185.24, 222

(56) References Cited

U.S. PATENT DOCUMENTS

| | | | |
|---|---|---|---|
| 6,111,790 A | * | 8/2000 | Miwa et al. ........... 365/185.24 |
| 6,201,742 B1 | | 3/2001 | Hirai et al. |
| 6,240,032 B1 | | 5/2001 | Fukumoto |
| 2002/0141242 A1 | | 10/2002 | Noguchi et al. |
| 2002/0181284 A1 | | 12/2002 | Kato |

FOREIGN PATENT DOCUMENTS

| | | |
|---|---|---|
| JP | 09306182 A | 11/1997 |
| JP | 11-162182 | 6/1999 |
| JP | 2001-76496 | 3/2001 |
| JP | 2002184191 A | 6/2002 |
| JP | 2002-324400 | 11/2002 |
| JP | 2003-051196 | 2/2003 |

* cited by examiner

Primary Examiner—Vu A. Le
(74) Attorney, Agent, or Firm—Arent Fox PLLC (57) ABSTRACT

A nonvolatile semiconductor memory device includes nonvolatile memory cells each configured to store 2-bit information per memory cell, and a control circuit configured to verify with a first threshold one or more bits subjected to writing of new data and to verify with a second threshold one or more bits subjected to refreshing of existing data in a program operation that performs the writing of new data and the refreshing of existing data simultaneously with respect to the nonvolatile memory cells, the second threshold being lower than the first threshold.

8 Claims, 6 Drawing Sheets

NONVOLATILE SEMICONDUCTOR MEMORY DEVICE WHICH STORES TWO BITS PER MEMORY CELL

CROSS-REFERENCE TO RELATED APPLICATION

This is a continuation of International Application No. PCT/JP2003/05457, filed on Apr. 28, 2003, the entire contents of which are hereby incorporated by reference.

BACKGROUND OF THE INVENTION

1. Field of the Invention

The present invention generally relates to nonvolatile semiconductor memory devices, and particularly relates to a programming circuit and programming method for use in a nonvolatile semiconductor memory device.

2. Description of the Related Art

In general, nonvolatile semiconductor memory devices such as flash memories use a current flowing through a reference cell having a predetermined threshold as a reference current, and compare a drain current of a memory cell read at the time of read operation with the reference current. Determination as to whether the data is "1" or "0" varies depending on whether the drain current of the read memory cell is greater than the reference current.

As the number of rewrite operations with respect to a flash memory increases, charge loss by which written charge is lost begins to occur, creating a tendency that the threshold of the memory cells in the core circuit decreases. With respect to those reference cells for which rewrite operations are not performed generally, on the other hand, the threshold stays fixed. As the number of rewrite operations increases, thus, there will be a situation in which the fixed threshold of a reference cell cannot provide a sufficient read margin.

As a method for obviating this problem, there is a dynamic reference read method. In this method, two types of reference cells corresponding to data "1" and data "0" are prepared as read reference cells, and the average is used as a reference current. In addition, these reference cells are subjected to rewrite operations in the same manner as memory cells. Namely, a reference cell Ref0 corresponding to programmed data "0" and a reference cell Ref1 corresponding to erased data "1" are provided, and an average of the two reference currents is used as a read reference current. Also, program/erase operations are performed on the reference cells concurrently with program/erase operations performed on the memory cells of the core circuit, thereby creating charge loss in the reference cells in the same manner as creating charge loss in the memory cells. This makes it possible to secure a sufficient read margin.

In the dynamic reference read method, a given reference cell is shared by a plurality of memory cells. When a given memory cells is programmed, a corresponding reference cell is also programmed. In this case, other memory cells sharing this reference cell suffers from an insufficient read margin when charge loss occurs. In order to avoid this, the other memory cells sharing this reference cell must be refreshed so as to be kept to the same level as the programmed memory cell.

Figure 1:
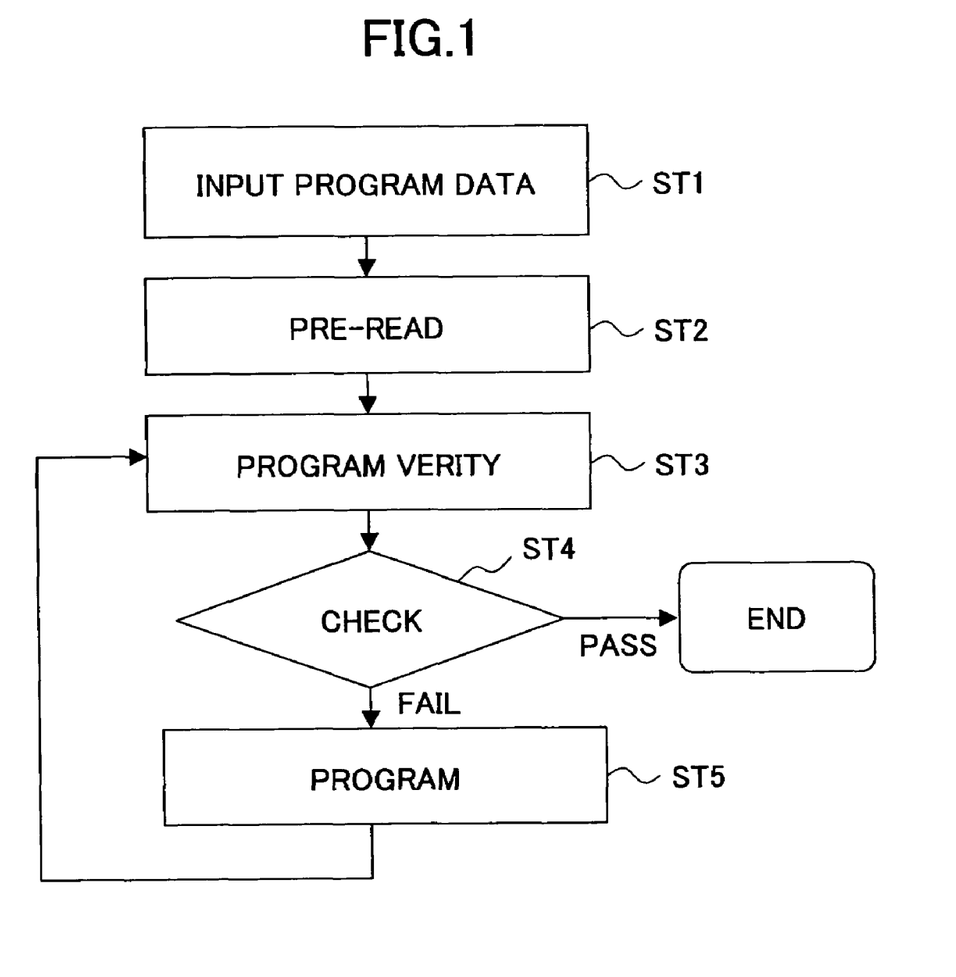
FIG. 1 is a flowchart showing an algorithm of a related-art program operation.

FIG. 1 is a flowchart showing an algorithm of a related-art program operation. FIG. 1 shows a flowchart of a page program method that programs data for a plurality of words by use of a page buffer.

At step ST1, program data is input into data latches of the page buffer. Here, one page is comprised of 16 words, for example. Two words among these 16 words, for example, receive the program data (write data).

At step ST2, pre-read operation is performed to read data from the memory cell array of the core circuit corresponding to the addresses in the page subjected to the program operation. The read data is stored in the data latches to which the program data was not input at step ST1. With this provision, those words which are not subjected to the program operation undergo a refresh operation (rewrite operation).

At step ST3, a program verify operation is performed. At step ST4, a check is made based on the result of the program verify operation as to whether the verify operation produces a pass result. If it fails, at step ST5, a program operation is performed with respect to the relevant memory cells (including program operations for the memory cells to be refreshed). The procedure then returns to step ST3, followed by performing the operations described above. If all the bits pass the verify operation, the procedure comes to an end.

A certain-type flash memory can store 2-bit information in a single memory cell by storing electric charge in a trap layer comprised of a nitride film or the like. In this kind of flash memory, a film comprised of an oxide film, a nitride film, and an oxide film is formed between the control gate and the substrate, and the nitride film traps electric charge therein to change the threshold, which represents data "0" or data "1". In this case, the trap layer comprised of the nitride film or the like is an insulating film, so that the electric charge does not move. The opposite ends of the trap layer can then store electric charge separately from each other, thereby storing 2-bit information in a single cell. Each bit of the 2-bit information can be independently retrieved by exchanging the roles between the drain and the source at the time of read operation.

Writing to the memory cell is performed through the injection of electron by channel hot electron. 9 V is applied to the gate electrode, 5 V applied to the drain, and 0 V applied to the source and the substrate, for example, thereby trapping hot electron generated in the channel. At this time, the hot electron is injected into the nitride film on the side near the drain. An erase operation is performed through the injection of hole by hot hole injection. Namely, $-6$ V is applied to the gate electrode, and 6 V applied to the drain, thereby injecting, into the nitride film, hole generated by an inter-band tunnel current running from the drain to the substrate. This neutralizes and erases the electric charge. When electric charge amounting to 2 bits is stored in one cell, the same voltage as applied to the drain is applied to the source to perform an erase operation. A read operation is carried out through a reverse read, which reverses the position of the drain from the drain position used in the write operation. Namely, a diffusion layer situated opposite the diffusion layer to which approximately 5 V is applied at the time of write operation is used as a drain, with 5V applied to the gate electrode, 1.5 V applied to the drain, and 0 V applied to the source and the substrate. If electric charge is stored in the nitride film on the side near the source, the trapped electric charge prevents the creation of a channel, resulting in no flow of an electric current. This makes it possible to read data "0".

In the flash memory that can store 2 bits in one cell as described above, the threshold relating to the reading of one of the two bits changes in response to the state of the bit that is opposite the bit selected for the read operation. That is, if the opposite bit from the one selected for the read operation is in the programmed state, the threshold is relatively large due to the effect of trapped electric charge that is programmed. If the opposite bit from the one selected for the read operation is in the erased state, the threshold is relatively small due to the absence of trapped electric charge corresponding to the erased state.

The dynamic reference read method described above may create an over-programmed state through refresh operations if the charge loss of the refreshed memory cells is small. Namely, it is possible to result in the state in which electric charge is overly injected. In this case, the flash memory capable of storing 2 bits encounters a problem in that the threshold may exhibit a rise that is not negligible at the opposite bit from the bit that is overly programmed.

[Patent Document 1] Japanese Patent Application Publication No. 2001-76496.

SUMMARY OF THE INVENTION

It is a general object of the present invention to obviate one or more problems in the related art.

It is a specific object of the present invention to prevent an over-programmed state of memory cells subjected to refresh operation in a flash memory that employs the dynamic reference read method and is capable of storing 2-bit information per memory cell.

To achieve the above-noted objects, a nonvolatile semiconductor memory device according to the present invention includes nonvolatile memory cells each configured to store 2-bit information per memory cell, and a control circuit configured to verify with a first threshold one or more bits subjected to writing of new data and to verify with a second threshold one or more bits subjected to refreshing of existing data in a program operation that performs the writing of new data and the refreshing of existing data simultaneously with respect to the nonvolatile memory cells, the second threshold being lower than the first threshold.

As described above, during the program operation that writes new data and refreshes existing data, a program verify operation for the bits to be programmed is performed separately from a refresh verify operation for the bits to be refreshed, with the threshold of the refresh verify operation being a lower threshold than the threshold of the program verify operation. With this provision, an over-programmed state of memory cells subjected to refresh operations is successfully prevented.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

Figure 2:
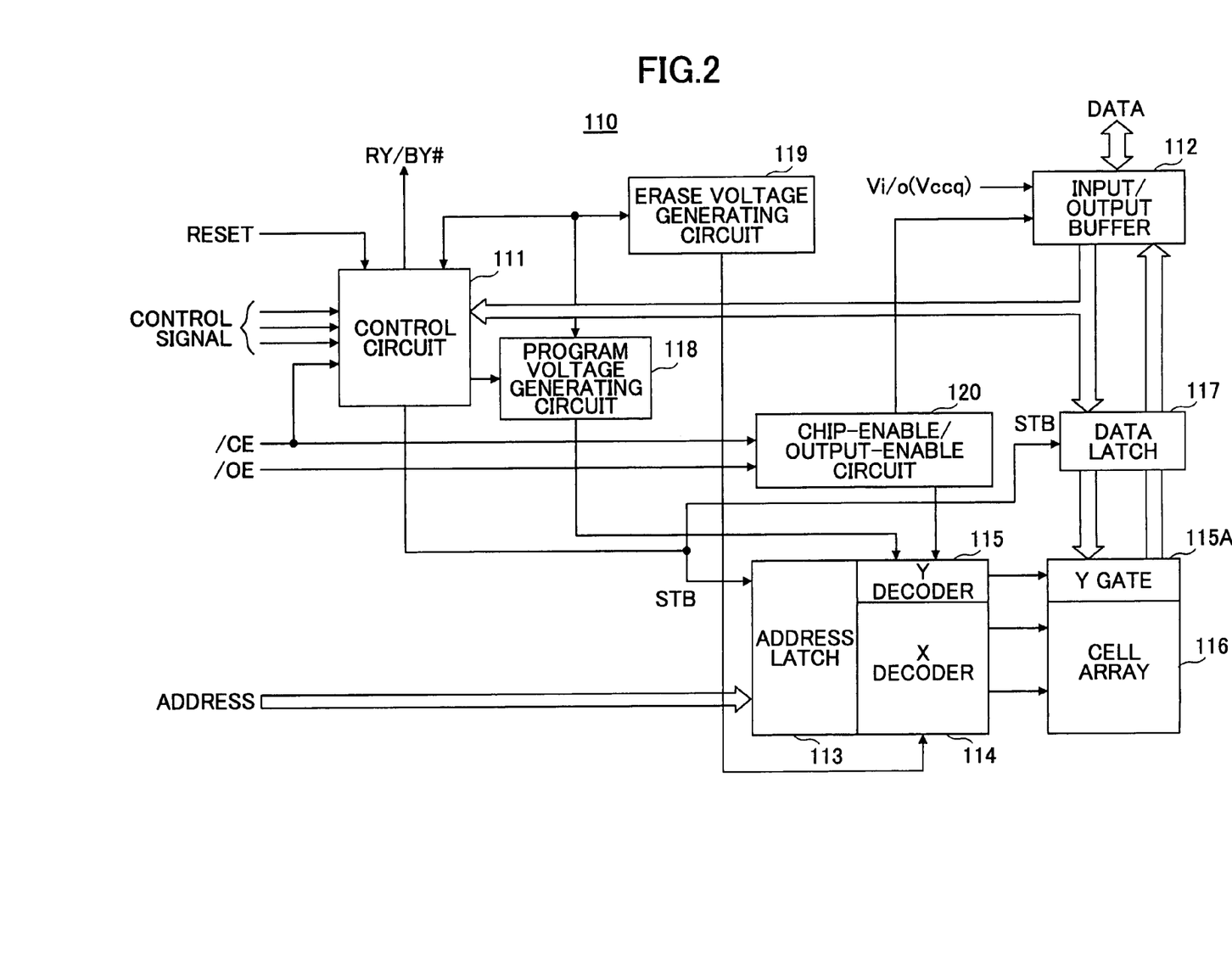
FIG. 2 is a drawing showing the construction of a nonvolatile semiconductor memory device to which the present invention is applied.

FIG. 2 is a drawing showing the construction of a nonvolatile semiconductor memory device to which the present invention is applied.

A nonvolatile semiconductor memory device 110 of FIG. 2 includes a control circuit 111, an input/output buffer 112, an address latch 113, an X decoder 114, a Y decoder 115, a Y gate 115A, a cell array 116, a data latch 117, a program voltage generating circuit 118, an erase voltage generating circuit 119, and a chip-enable/output-enable circuit 120.

The control circuit 111 receives control signals from an exterior, and operates as a state machine based on the control signals, thereby controlling individual units of the nonvolatile semiconductor memory device 110.

The input/output buffer 112 receives data from the exterior, and supplies the data to the data latch 117. The address latch 113 receives and latches an address signal supplied from the exterior, and supplies the address signal to the X decoder 114 and the Y decoder 115. The X decoder 114 decodes the address supplied from the address latch 113, and activates a word line arranged in the cell array 116 in response to the decoding result. The Y decoder 115 decodes the address supplied from the address latch 113, and selectively opens/closes the Y gate 115A based on the decoded address signal. With this provision, the Y gate 115A selectively couples the bit lines of the cell array 116 to the data latch 117.

The cell array 116 includes an array of memory cell transistors, word lines, bit lines, etc., and stores data in each memory cell transistor. At the time of data read operation, data of the memory cells specified by the activated word line is read to the bit lines. At the time of program or erase operation, the word line and the bit lines are set to proper potentials suitable for these respective operations, thereby performing injection of electric charge or ejection of electric charge with respect to the memory cells. The cell array 116 is divided into a plurality of sectors each containing a memory cell array, so that an erase operation is performed separately for each sector. In the present invention, the gate of the memory cell transistor store electric charge in a trap layer made of a nitride film or the like, thereby storing 2-bit information in a single memory cell.

The data latch 117 receives a data current selected by the Y decoder 115 and the X decoder 114 supplied from the cell array 116, and compares the data current with a reference current, thereby determining whether the data is 0 or 1. The result of the determination is supplied to the input/output buffer 112 as read data. The present invention employs the dynamic reference read method, in which two types of reference cells corresponding to data "1" and data "0" are provided as read reference cells, and the average current is used as a reference current.

A verify operation associated with program operation or erase operation is performed by comparing the data current selected by the Y decoder 115 and the X decoder 114 supplied from the cell array 116 with the reference current provided by program-verify-purpose reference cells or by erase-verify-purpose reference cells. In the program operation, write data is stored in buffers of the data latch 117. The word lines and bit lines of the cell array 116 are set equal to proper potentials in response to this data, thereby carrying out injection of electric charge into the memory cells.

In FIG. 2, the data latch 117 is shown as a single block that includes the individual components for performing the above-described operations, i.e., the data latches and write buffers for storing data to be written, sense amplifiers for sensing data supplied from the cell array 116, the various reference cells, etc.

The program voltage generating circuit 118 generates a high voltage for the program purpose under the control of the control circuit 111. This high voltage for the program purpose is supplied to the cell array 116 through the X decoder 114, thereby providing for a data write operation to be performed based on the write data stored in the data latch 117. The erase voltage generating circuit 119 generates a negative voltage for the erase purpose under the control of the control circuit 111. This negative voltage for the erase purpose is supplied to the cell array 116 through the X decoder 114, thereby providing for an erase operation to be performed in the cell array 116.

The chip-enable/output-enable circuit 120 receives a chip-enable signal /CE and an output-enable signal /OE as control signals from the exterior of the device, and controls whether to activate/inactivate the input/output buffer 112 and the cell array 116.

Figure 3:
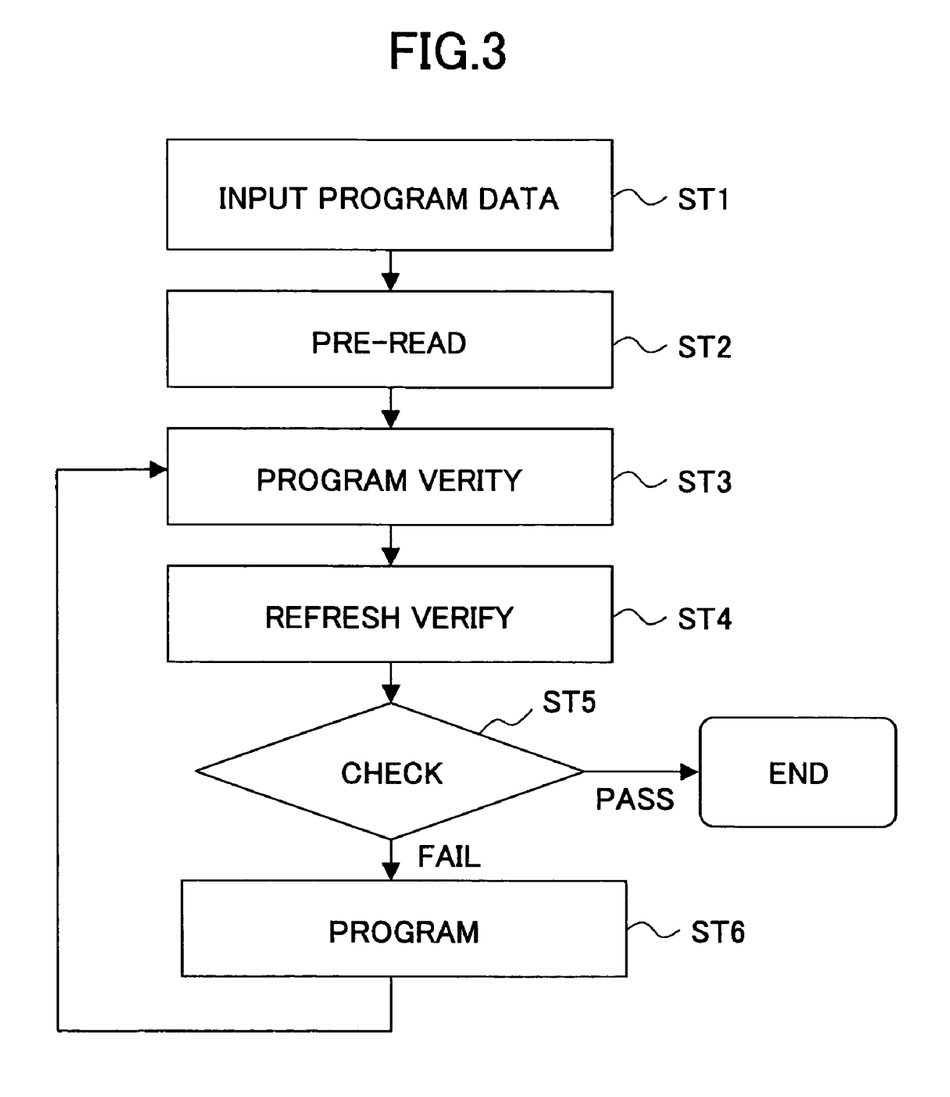
FIG. 3 is a flowchart showing an algorithm of a programming operation according to the present invention.

FIG. 3 is a flowchart showing an algorithm of the programming operation according to the present invention.

At step ST1, program data is input into data latches of the page buffer. Here, one page is comprised of 16 words, for example. Two words among these 16 words, for example, receive the program data (write data).

At step ST2, a pre-read operation is performed to read data from the memory cell array of the core circuit corresponding to the addresses of the page subjected to the program operation. The read data is stored in the data latches to which the program data was not input at step ST1. With this provision, those words which are not subjected to the program operation undergo a refresh operation (rewrite operation).

At step ST3, a program verify operation is performed. This program verify operation is performed only with respect to the data subjected to the program operation among the data stored in the data latches of the page buffer.

At step ST4, a refresh verify operation is performed. This refresh verify operation is performed only with respect to the data subjected to refresh operations among the data stored in the data latches of the page buffer. A reference threshold for this refresh verify operation is set to a lower level than the reference threshold of the program verify operation.

At step ST5, a check is made based on the results of the program verify operation and the refresh verify operation as to whether the verify operations produce a pass result. If they fail, at step ST6, a program operation (i.e., program operation for writing new data and also for refreshing existing data) is performed with respect to the relevant memory cells. The procedure then returns to step ST3, followed by performing the operations described above. If all the bits pass the verify operations, the procedure comes to an end.

As described above, during the program operation that writes new data and refreshes the existing data, a program verify operation for the bits to be programmed is performed separately from a refresh verify operation for the bits to be refreshed, with the threshold of the refresh verify operation being lower than the threshold of the program verify operation. With this provision, an over-programmed state of memory cells subjected to refresh operations is successfully prevented.

Figure 4:
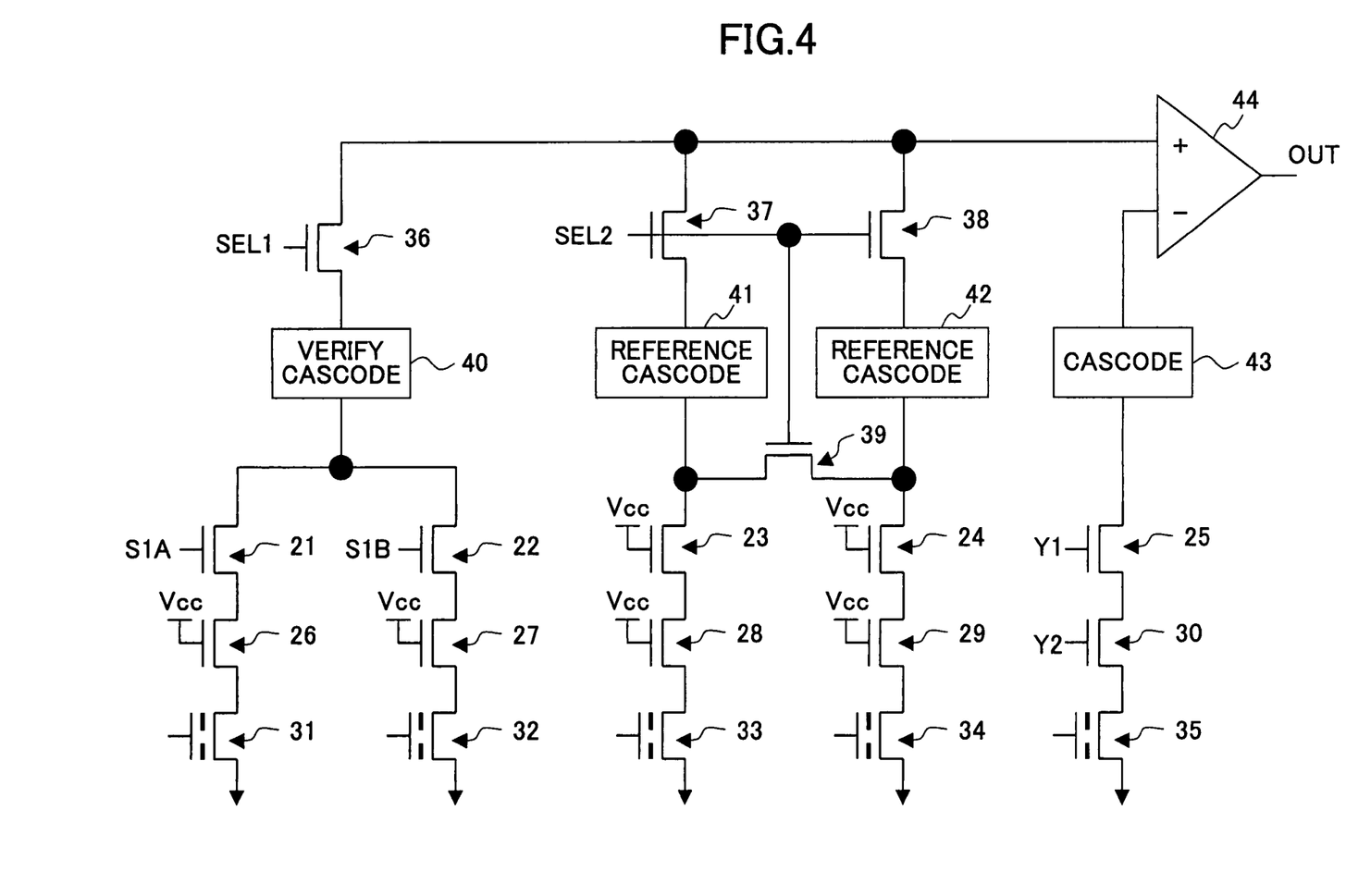
FIG. 4 is a drawing showing an example of a circuit configuration surrounding reference cells according to the present invention.

FIG. 4 is a drawing showing an example of a circuit configuration surrounding the reference cells according to the present invention.

The circuit of FIG. 4 includes NMOS transistors 21 through 30, reference cell transistors 31 through 34, a memory cell transistor 35, NMOS transistors 36 through 39, a verify cascode circuit 40, reference cascode circuits 41 and 42, a cascode circuit 43, and a sense amplifier 44. The memory cell transistor 35 is a memory cell selected in the memory cell array contained in the core circuit (i.e., the cell array 116 of FIG. 2). The NMOS transistors 25 and 30 correspond to the Y gate 115A of FIG. 2, and select the memory cell transistor 35 in response to HIGH levels of signals Y1 and Y2. The verify cascode circuit 40, the reference cascode circuits 41 and 42, and the cascode circuit 43 serve to convert a current running through a cell transistor into a voltage level. Signals SEL1, SEL2, S1A, and S1B serve to select reference cells, and are supplied from the control circuit 111 shown in FIG. 2.

One input (−) of the sense amplifier 44 receives a voltage corresponding to data of the memory cell transistor 35 provided in the core circuit as the voltage is supplied from the cascode circuit 43.

At the time of data read operation, the signal SEL1 is set to LOW, and the signal SEL2 is set to HIGH. As a result, the other input (+) of the sense amplifier 44 receives, from the reference cascode circuits 41 and 42, an average of the voltage corresponding to data of the reference cell transistor 33 and the voltage corresponding to data of the reference cell transistor 34. Here, the reference cell transistors 33 and 34 correspond to the state "1" and the state "0", respectively. With this provision, the sense amplifier 44 compares the average threshold of the reference cell transistor state "1" and the reference cell transistor state "0" with the threshold of a read memory cell, thereby sensing the data state. It should be noted that the present invention is designed for use with the nonvolatile memory cells capable of storing 2-bit data per cell. In this case, the states of the two reference cells described above are "0/1" and "1/0".

At the time of program verify operation, the signal SEL1 is set to HIGH, and the signal SEL2 is set to LOW. Further, the signal S1A and signal S1B are set to HIGH and LOW, respectively. As a result, the reference cell transistor 31 is selected, with its current being converted into a voltage level by the verify cascode circuit 40 for provision to the input (+) of the sense amplifier 44. As a result, the sense amplifier 44 compares the threshold for the program verify operation with the threshold of the memory cell in the core circuit, thereby sensing the data state.

At the time of refresh verify operation, the signal SEL1 is set to HIGH, and the signal SEL2 is set to LOW. Further, the signal S1A and signal S1B are set to LOW and HIGH, respectively. As a result, the reference cell transistor 32 is selected, with its current being converted into a voltage level by the verify cascode circuit 40 for provision to the input (+) of the sense amplifier 44. As a result, the sense amplifier 44 compares the threshold for the refresh verify operation with the threshold of the memory cell in the core circuit, thereby sensing the data state.

The threshold of the program-verify-purpose reference cell 31 differs from the threshold of the refresh-verify-purpose reference cell 32. The refresh-verify-purpose threshold is lower. With this provision, an over-programmed state of memory cells subjected to refresh operations is successfully prevented.

Figure 5:
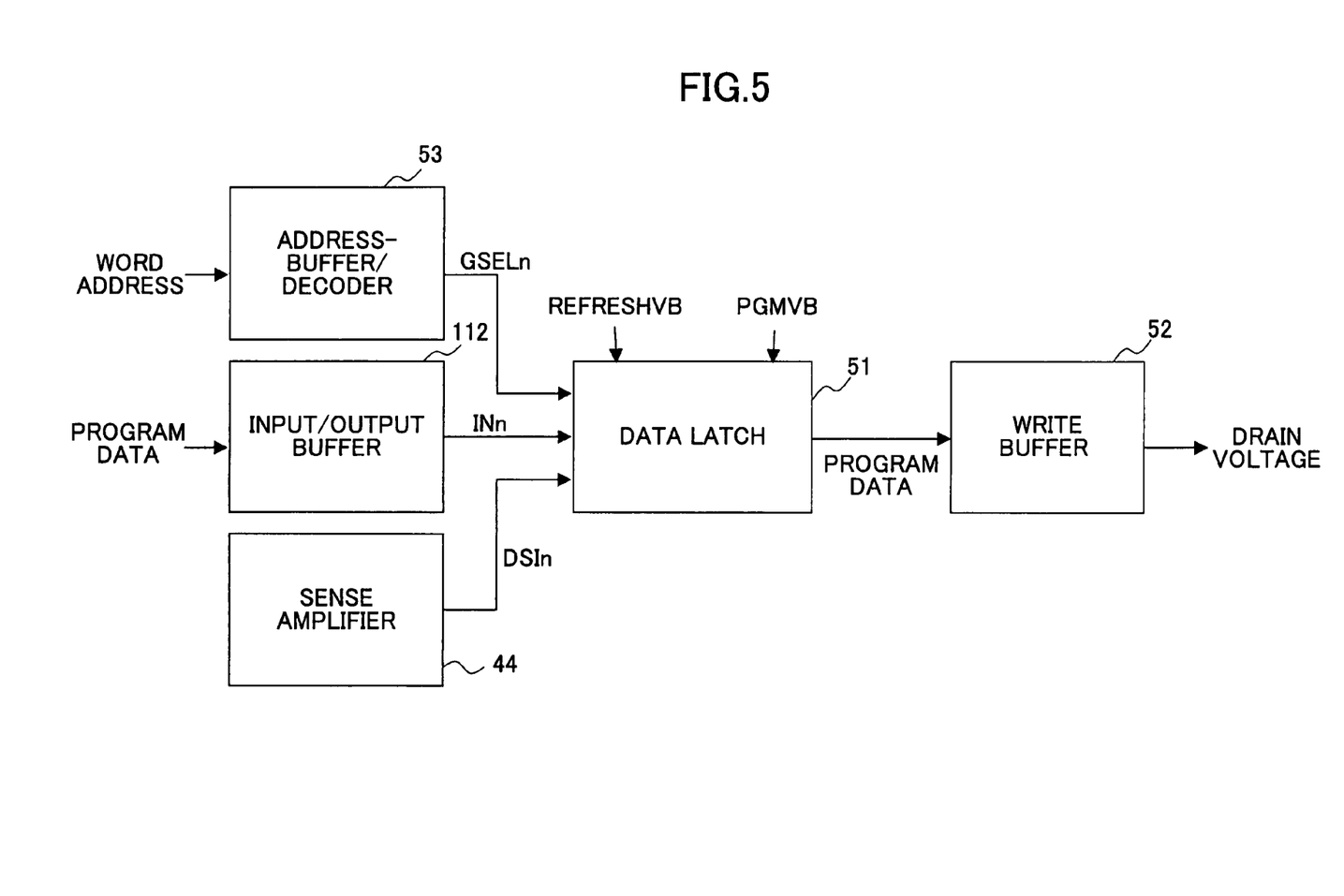
FIG. 5 is a block diagram for explaining the construction for programming memory cell transistors.

FIG. 5 is a block diagram for explaining the construction for programming memory cell transistors.

The construction of FIG. 5 includes a data latch 51, a write buffer 52, an address-buffer/decoder 53, an input/output buffer 112, and a sense amplifier 44. The input/output buffer 112 is illustrated in FIG. 2, and the sense amplifier 44 is shown in FIG. 4. The address-buffer/decoder 53 corresponds to the address latch 113 and the Y decoder 115 shown in FIG. 2.

The data latch 51 is provided separately for each bit with respect to all the bits of the page to be programmed. This latch controls whether or not to program each bit. Data indicative of whether or not to program each bit is supplied from the input/output buffer 112 as program data INn. Further, whether to load program data to the data latch 51 is controlled by an address decode signal GSELn. The data latch 51 that did not have program data loaded thereto receives sense data DSIn of a corresponding memory cell supplied from the sense amplifier 44, so that a refresh operation will be performed on this bit. The sense data DSIn supplied from the sense amplifier 44 is also used as check data for program verify operation.

When all the data latches 51 have program data or refresh-purpose data stored therein, these data items are transferred to the write buffer 52. Thereafter, a program voltage is applied to the drain nodes of memory cell transistors based on the data stored in the write buffer 52. Concurrently with this, a program voltage is applied via a word line to the gate nodes of the memory cells subjected to the program operation, thereby performing a program operation.

As shown in FIG. 5, the data latch 51 of the present invention receives a program verify signal PGMVB indicative of a program verify operation and a refresh verify signal REFRESHVB indicative of a refresh verify operation. With this provision, it is possible to perform a program verify operation and a refresh verify operation separately from each other, thereby separating the data latches for performing a program verify operation and the data latches for performing a refresh verify operation.

Figure 6:
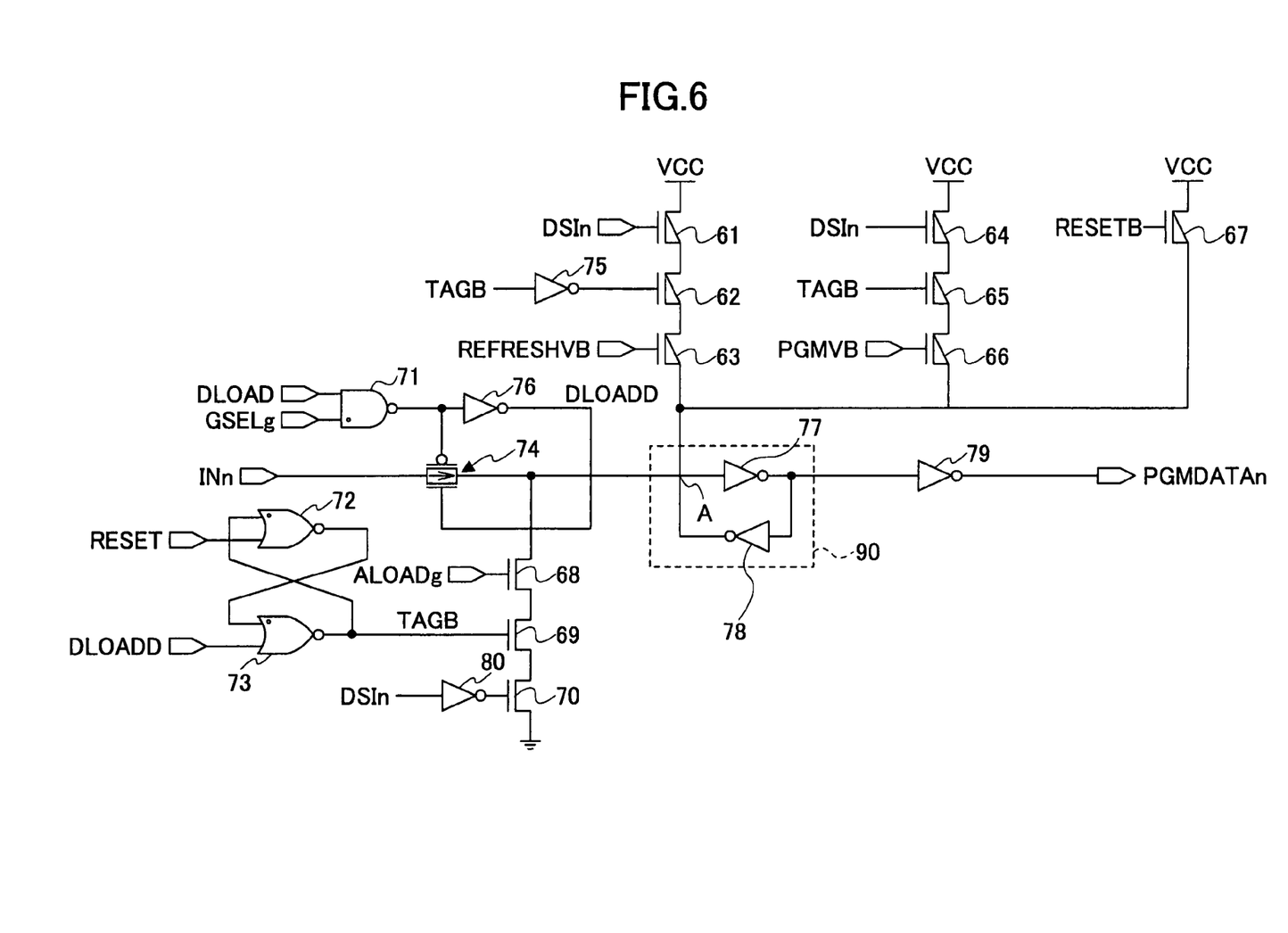
FIG. 6 is a circuit diagram showing an example of the circuit configuration of a data latch.

FIG. 6 is a circuit diagram showing an example of the circuit configuration of the data latch 51.

The data latch 51 of FIG. 6 includes PMOS transistors 61 through 67, NMOS transistors 68 through 70, a NAND gate 71, NOR gates 72 and 73, a transfer gate 74, and inverters 75 through 80. The inverters 77 and 78 are connected to each other such as to take the output of each other as an input, thereby forming a latch 90.

In an initial state, an inverted reset signal RESETB is set to LOW, so that the latch 90 is set such as to have HIGH at a node A. Further, a reset signal RESET is set to HIGH, so that an output TAGB of a flip-flop comprised of the NOR gates 72 and 73 is HIGH in the initial state.

As a data load signal DLOAD and the address decode signal GSELg indicating the illustrated data latch are changed to HIGH, program data INn is input into the latch 90 through the transfer gate 74. When the illustrated bit is to be programmed, the latch 90 stores "0", so that the node A is set to LOW. When the illustrated bit is to be placed in the erased state, the latch 90 stores "1", so that the node A is set to HIGH.

When the transfer gate is placed in a conductive state so as to latch the program data INn, a signal DLOADD that is the output of the inverter 76 is HIGH. This HIGH signal DLOADD is supplied to the NOR gate 73, so that the output TAGB of the flip-flop changes to LOW. In response, the NMOS transistor 69 is placed in a nonconductive state with respect to the latch in which the program data INn has been written. Accordingly, even when a signal ALOADg requesting the reading of data from a corresponding memory cell in the core circuit is subsequently changed to HIGH, the latch 90 does not latch the sense data DSIn of the corresponding memory cell.

In the data latch that has not latched the program data INn, the signal DLOADD that is the output of the inverter 76 stays LOW. As a result, the output TAGB of the flip-flop is maintained at the HIGH level. With this provision, the NMOS transistor 69 is placed in a conductive state in the data latch that has not latched the program data INn. When the signal ALOADg requesting the reading of data from a corresponding memory cell in the core circuit is subsequently changed to HIGH, the latch 90 latches the sense data DSIn of the corresponding memory cell. That is, the conductive/nonconductive state of the NMOS transistor 70 is controlled in response to the sense data DSIn of the corresponding memory cell, so that the sense data DSIn of the corresponding memory cell is stored in the latch 90. In the data latch that has not latched the program data INn, thus, the latch 90 stores the sense data DSIn of the corresponding memory cell, which is then subjected to refresh operation.

In this manner, the inputting of program data and pre-read operation are performed as specified in steps ST1 and ST2 of FIG. 3. At step ST3, then, a program verify operation is performed, followed by a refresh verify operation performed at step ST4.

In the program verify operation, the program verify signal PGMVB is set to LOW, thereby making the PMOS transistor 66 conductive. In the data latch that has latched the program data INn, TAGB is LOW, so that the PMOS transistor 65 is in the conductive state. At this time, the sense amplifier 44 shown in FIG. 4 is comparing the program-verify-purpose threshold of the reference cell transistor 31 with the threshold of the corresponding memory cell in the core circuit, thereby sensing the data state. In FIG. 6, thus, the sense data DSIn supplied to the gate of the PMOS transistor 64 is LOW if the program verify operation produces a pass result. The PMOS transistor 64 thus becomes conductive, and the node A of the latch 90 is set to HIGH, thereby performing no operation to program the illustrated bit. If the verify operation fails, the node A of the latch 90 stays in the state that is set by the data. If the node A of the latch 90 is LOW, the operation for programming the illustrate bit is performed at step ST6 of FIG. 3.

In the program verify operation, TAGB is HIGH with respect to the data latch that has not latched the program data INn, so that the PMOS transistor 65 is in the nonconductive state. The result of the program verify operation thus does not affect the data stored in the latch 90.

In the refresh verify operation, the refresh verify signal REFRESHVB is LOW, so that the PMOS transistor 63 becomes conductive. In the data latch subjected to refresh operation, TAGB is HIGH, so that the PMOS transistor 62 is in the conductive state. At this time, the sense amplifier 44 shown in FIG. 4 is comparing the refresh-verify-purpose threshold of the reference cell transistor 32 with the threshold of the corresponding memory cell in the core circuit, thereby sensing the data state. In FIG. 6, thus, the sense data DSIn supplied to the gate of the PMOS transistor 61 is LOW if the refresh verify operation produces a pass result. The PMOS transistor 61 thus becomes conductive, and the node A of the latch 90 is set to HIGH, thereby performing no operation to program the illustrated bit. If the verify operation fails, the node A of the latch 90 stays in the state that is set by the data. If the node A of the latch 90 is LOW, the operation for programming the illustrate bit is performed at step ST6 of FIG. 3.

In the refresh verify operation, TAGB is LOW with respect to the data latch that is not subjected to refresh operation, so that the PMOS transistor 62 is in the nonconductive state. The result of the refresh verify operation thus does not affect the data stored in the latch 90.

In the manner as described above, a program verify operation and a refresh verify operation are performed separately, thereby successfully separating the data latches for performing the program verify operation and the data latches for performing the refresh verify operation. With this provision, therefore, an over-programmed state of memory cells subjected to refresh operation is prevented by setting the refresh verify threshold to a lower threshold than the program verify threshold.

Although the present invention has been described with reference to embodiments, the present invention is not limited to these embodiments. Various variations and modifications may be made without departing from the scope of the claimed invention.

What is claimed is:

1. A nonvolatile semiconductor memory device, comprising:
    nonvolatile memory cells each configured to store 2-bit information per memory cell; and
    a control circuit configured to verify with a first threshold one or more bits subjected to writing of new data and to verify with a second threshold one or more bits subjected to refreshing of existing data in a program operation that performs the writing of new data and the refreshing of existing data simultaneously with respect to the nonvolatile memory cells, said second threshold being lower than said first threshold.

2. The nonvolatile semiconductor memory device as claimed in claim 1, further comprising two reference cells for checking read data, wherein data read from the nonvolatile memory cells is sensed based on an average of thresholds of said two reference cells.

3. The nonvolatile semiconductor memory device as claimed in claim 1, further comprising:
    a first reference cell to set the first threshold; and
    a second reference cell to set the second threshold.

4. The nonvolatile semiconductor memory device as claimed in claim 3, further comprising:
    a sense amplifier to sense data supplied from said nonvolatile memory cells; and
    a selecting circuit configured to select and couple said first reference cell to said sense amplifier when verifying with the first threshold the one or more bits subjected to the writing of new data and to select and couple said second reference cell to said sense amplifier when verifying with the second threshold the one or more bits subjected to the refreshing of existing data.

5. The nonvolatile semiconductor memory device as claimed in claim 4, further comprising a plurality of data latches operable to latch the new data and the existing data, each of said data latches includes:
    a first circuit to reset latch data in response to a result of sensing by said sense amplifier with respect to a corresponding memory cell when verifying with the first threshold the one or more bits subjected to the writing of new data; and
    a second circuit to reset latch data in response to a result of sensing by said sense amplifier with respect to a corresponding memory cell when verifying with the second threshold the one or more bits subjected to the refreshing of existing data,
    wherein a selected one of said first circuit and said second circuit is activated in response to whether the new data is stored as the latch data or the existing data is stored as the latch data.

6. The nonvolatile semiconductor memory device as claimed in claim 1, further comprising a plurality of data latches operable to latch the new data and the existing data, each of said data latches includes:
    a first circuit to reset latch data in response to a result of verifying with the first threshold a bit of a corresponding memory cell when the new data is stored as the latch data;
    a second circuit to reset the latch data in response to a result of verifying with the second threshold a bit of a corresponding memory cell when the existing data is stored as the latch data.

7. A method of programming a nonvolatile semiconductor memory device in which data read from nonvolatile memory cells operable to store 2-bit information per memory cell is sensed based on an average of thresholds of two reference cells, comprising:
    storing program data in one or more first data latches; and
    storing data read from the nonvolatile memory cells in one or more second data latches;
    programming the data stored in the one or more first data latches and the data stored in the one or more second data latches simultaneously to the nonvolatile memory cells, wherein the step of programming includes:
    verifying with a first threshold one or more bits of the nonvolatile memory cells corresponding to the one or more first data latches; and
    verifying with a second threshold one or more bits of the nonvolatile memory cells corresponding to the one or more second data latches, said second threshold being lower than said first threshold.

8. A method of programming a nonvolatile semiconductor memory device in which data read from nonvolatile memory cells operable to store 2-bit information per memory cell is sensed based on an average of thresholds of two reference cells, comprising:
    refreshing existing data simultaneously with writing of new data with respect to the nonvolatile memory cells;
    verifying with a first threshold one or more bits subjected to the writing of the new data; and
    verifying with a second threshold one or more bits subjected to the refreshing of the existing data, said second threshold being lower than said first threshold.

* * * * *